United States Patent [19]
Berggren et al.

[11] Patent Number: 5,932,965
[45] Date of Patent: Aug. 3, 1999

[54] ELECTROLUMINESCENT DEVICE AND A METHOD FOR FABRICATING AN ELECTROLUMINESCENT DEVICE

[75] Inventors: Rolf Magnus Berggren; Tord Peter Dyreklev; Olle W Inganäs, all of Linköping, Sweden

[73] Assignee: Forskarpatent I Linkoping AB, Linkoping, Sweden

[21] Appl. No.: 08/765,812
[22] PCT Filed: Jul. 14, 1995
[86] PCT No.: PCT/SE95/00859
§ 371 Date: Apr. 1, 1997
§ 102(e) Date: Apr. 1, 1997
[87] PCT Pub. No.: WO96/03015
PCT Pub. Date: Feb. 1, 1996

[30] Foreign Application Priority Data

Jul. 19, 1994 [SE] Sweden .................................. 9402546

[51] Int. Cl.[6] ....................................... H01J 1/62
[52] U.S. Cl. ........................ 313/506; 313/500; 313/501; 313/509
[58] Field of Search ...................... 313/498, 500, 313/501, 505, 506, 509

[56] References Cited

U.S. PATENT DOCUMENTS 5,217,650  6/1993  Theophilou et al. .................. 252/500
5,317,169  5/1994  Nakano et al. ............................ 257/40

FOREIGN PATENT DOCUMENTS

WO 94/03031  2/1994  WIPO ............................ H05B 33/14
WO 94/15368  7/1994  WIPO ............................ H01L 33/00

OTHER PUBLICATIONS

Dialog Information Service, file 351, Derwent WPI, Dialog accession No. 009592042, WPI accession No. 93–285588/36, Sumitomo chem Co. Ltd: "Organic electroluminescenceelement used for planar light source–consisting of luminous layer contg. conjugated system copylymer composed of at least two repeat units contg. sryryl gps.", & JP 5202355, A, 930810, 9336 (Basic), Aug. 10, 1993.

STN International, File CA, vol. 120, No. 16, Apr. 18, 1994, (Columbus Ohio, US), Yamamoto Takakazu et al: "Polymer light–emitting diodes with single– and double–layer structures using poly (2,3–diphenylguinoxaline–5, 8–diyl)", abstract No. 193495, & Jpn. J. Appl. Phys., Part 2 (1994), 33 (28), L250–L253.

Dyreklev et al., "Aligned Polymer Chain Field Effect Transistors", *Solid State* Communications, vol. 82, No. 52, pp. 317–320, 1992.

*Primary Examiner*—Vip Patel
*Attorney, Agent, or Firm*—Pillsbury Madison & Sutro LLP

[57] ABSTRACT

For providing an electroluminescent device, a first electrode is formed on a substrate that is preferably transparent or translucent, and a first light-emitting layer made of polymeric material is formed on the first electrode and n the substrate. A second light-emitting layer made of polymeric material is formed on a support, preferably stretched together with the support, for orienting the polymeric material thereof, then laminating to the first light-emitting layer and the support is removed. A second electrode is applied on the second light-emitting layer, and the two electrodes are provided with connectors for electrically connecting the device to other structures.

28 Claims, 5 Drawing Sheets

ELECTROLUMINESCENT DEVICE AND A METHOD FOR FABRICATING AN ELECTROLUMINESCENT DEVICE

This application is the national phase of International application PCT/SE95/00859, filed Jul. 14, 1995, which designated the U.S.

BACKGROUND OF THE INVENTION

This invention concerns electroluminescent devices and a way of fabricating these, in particular devices which have conjugated polymers as emitting layers.

Electroluminescent devices of the type which this invention concerns, have frequently been reported. As examples of this one can mention PCT/WO 90/13148, PCT/WO 9203490, PCT/WO 92/03491, PCT/WO 93/14177, PCT/WO 94/03030, PCT/WO 94/03031 and U.S. Ser. No. 317, 169. These devices have been developed to a considerable extent and new useful fields of application have been found, since the report made by J H Burroughes et al, Nature 347, 539–541 (1991). Thus, different researchers have described improvements which have resulted in that these devices emit light of any color throughout the entire visible spectrum G. Grem et al., Advanced Materials 4, 36–37 (1992); D Braun et al., Applied Physics letters 58, 1982–1984 (1991); and C Zhang et al., Journal of Electronic Materials 22, 413–17 (1993). N. C. Greenham et al. have reported on high quantum efficiency devices in Nature 365, 628–630 (1993), while Goran Gustafsson et al. have reported on the possibility of fabricating large area and flexible light emitting devices.

Conjugated polymers, being organic macromolecules, have offered new possibilities, which earlier have not been obtainable. One advantage of using conjugated polymers as materials in light emitting devices is that the layers can be processed and constructed using solvents, see the PCT publications mentioned above and A. Assadi et al., Applied Physics Letters 53, 1995 (1998) and Ji H. Burroughes et al., Nature 335, 137 (1988). Another advantage is that small chemical modifications of the polymers results in a tunability of the band gap (the color of the emitted light) B. H. Xui, Macromolecules 26, 4457 (1993) and R. E. Gill et. al. Advanced Materials 6, 132 (1994).

If one would like to fabricate devices, each of which consists of more than one emitting layer or which consists of one or more barrier layers, one has, to prevent the already existing layers from being damaged during the fabrication of the next layer placed on top thereof, needed to add different layers from different solvents which not destroy the underlying layer/layers. This problem is particularly obvious, if one would like to fabricate devices each of which consists of layers with thicknesses in the range of 20–100 nm. This restriction of the fabrication procedure is sometimes unfortunate, since it limits the freedom of choice when combining different types of conjugated polymers for the different layers.

SUMMARY OF THE INVENTION

One purpose with this invention is thus to provide a new type of electroluminescent device and a way to fabricate such a device without restricting the type of solvents when choosing the different layers of the device. Another purpose with this invention is to fabricate multilayer light emitting devices which offer more freedom of choice to combine different polymers to achieve emission of any color. A further purpose with this invention is that in such a device and in such a way of fabrication it will be possible in an intermediate step to treat one or several specific layer or layers without affecting the other layers.

The chains of conjugated polymers are randomly oriented in the bulk material. Through orientation of the chains it is possible to achieve an anisotropic structure with strong anistropic properties, almost one dimensional properties. This possibility to achieve anisotropic properties has been studied through the investigation of photoluminescence of oriented polymer films D. D. C. Bradeley et al., "Infrared characterization of Oriented Poly(phenylenevinylene)", Polymer 27, 1709 (1986) and T. W. Hagler et al., Physical Review B 44, 8652 (1991) and through the study of conductivity of electrons. All of these studies have been done on thick polymer layers, which because of their thickness, are unsuitable for or at least show disadvantages to use in electroluminescent devices or in light emitting diodes of a kind which can be utilized in displays.

Despite that it is known that it is possible to orient luminescent polymers, none has up to now been able to use the stretching technique together with the construction of the luminescent diodes with extremely thin luminescent layers of conjugated polymers. The reasons for this are that the layers are not self-supporting and that they, because of this, need to be applied directly onto a carrier or a support, onto which one has already applied at least a first electrode or a first charge injection layer. It has not been possible to stretch the carrier or the support together with the emitting layer. The reason for this is that the electrode or the charge injection layer would be damaged or disturbed during such treatment. As far as it is known all electroluminescent devices, which have been fabricated utilizing conjugated polymers, have had isotropic properties, i. e. the polymer chains have been oriented randomly.

There exists requirements for electroluminescent devices or electroluminescent diodes, which emit polarised light, for example in connection with displays in computer screens. Another advantage with this invention is to fabricate light emitting devices each consisting of a thin layer of conducting polymers which are oriented, sandwiched between two electrodes with or without injection-barrier layers, which emits polarised light. Another advantage of the invention is to achieve an effective way for the building of such devices.

When making use of the invention, an electroluminescent device is achieved that has a supporting structure or substrate, preferably fabricated from transparent or translucent material a first electrode layer applied on this, a light emitting layer of a conjugated polymer displaying a light emitting ability applied on the first electrode layer and the substrate, and a second electrode layer applied on top of the light emitting layer, the electroluminescent device also being provided with connections to the two electrode layers.

In accordance with the invention, the light emitting layer includes a separately made and a continuous light emitting layer. Preferably this layer is pre-treated, in particular stretched in one direction for the orientation of the main part of the chains in the polymer material in this direction. In a further development, the light emitting layer consists of more than one part layer. The invention can also be utilized in electroluminescent devices in each of which the injection properties are enhanced through the addition of an enhancing layer the transport of the charge carriers of which is placed between the electrode and the light emitting layer or layers.

In the fabrication of this electroluminescent device in accordance with the invention, a method is utilized in which at least one part of the light emitting layer is added by transferring it from a carrier. The light emitting layer is first created on this carrier, the transfer from the carrier to the underlying layer being carried out after the pre-treatment of this layer, in particular by a stretch orientation of the polymer chains.

In the fabrication of field effect transistors, it is already known to build a very thin layer of a conjugated polymer on top of a foil layer and then stretch the foil together with the polymer layer to orient the polymer chains P. Dyreklev, Maligned Polymer Chain Field Effect Transistorsn, Solid State Communications, vol. 82, 5,317–320 (1992), but, in this case, the polymer film never gets separated from the barrier foil. In this article, studies of the anisotropic mobility—of poly(3-octyltiofen) are presented for the undoped state. The mobility was estimated using a field effect transistor, which had been added by the carrier with the polymer film. The anisotropy increased with increased orientation, up to the value of 4. In the article properties concerning rest dopants, anisotropy in the conjugation length, internal anisotropy in the charge transport along and in between the chains and also crystallinity and monodispers conjugation length were discussed. In the article, it is mentioned, on page 317, that it is possible to add the polymer film to the carrier and to orient the film through stretching of the carrier and the polymer film. A degree of orientation as high as 0.82 was reported with these kind of films on different substrates, where patterned metal electrodes are included. This has provided the possibility of fabricating field effect transistors of stretch oriented polymers. In this article, it has been described that poly(3-octylphenylthiophene) was added to a carrier of polyethylene-foil (PE), but as described at page 318 lines 10–17, it was possible to remove both the carrier and the polymer film and add them to the structure once again but at a different orientation direction. In other words, the active layer of conjugated polymer was never separated from the carrier foil.

The invention differs from the above-mentioned technique, since the polymer film is separated from the carrier. The carrier, in this invention, is just used as a temporary carrier where some intermediate treatment occurs. After the treatment, the polymer film is then transferred to the final device or substrate.

In the detailed description provided below, examples the invention have been executed using glass slides as substrates for the electroluminescent device. The invention can, of course, be combined with other types of substrates, flexible substrates and large area substrates.

When the invention is utilized for the fabrication of devices, which emit polarised light, it is possible to achieve a high degree of polarization, ratios between light intensity parallel to the polymer chain orientation direction and light intensity perpendicular to the orientation direction, when the polymer film is elongated twice compared to the initial length. In this elongation, a polarization degree of 3.1 is achieved between the electroluminescence intensity parallel and perpendicular to the orientation direction. The emission spectra parallel and perpendicular to the stretching direction are not changed very much. Quantum efficiencies of 0.1% have been reached in devices where the invention has been utilized.

In this device, and in accordance with other electroluminescent devices based on conjugated polymers of the same type, an emitting layer is sandwiched between two electrodes. In this invention this emitting layer may consist of more than one part, and also a combination of emitting layers and charge injection/charge barrier layers. As the device is biased, the electrodes inject charges into the device and into the emitting layer. The charges, electrons and holes, recombine through the formation of an excited state, an excitor, which emits the energy as light. To achieve high quantum efficiency, photons emitted per electrons injected, the positive electrode is a high work function material and the minus electrode a low work function material. In this invention, ITO (indium tin oxide) and calcium are used as a high work function material and as a low work function material, respectively. Other known kinds of material can also be used as electrodes in these devices; one example is described, for instance, by Goran Gustafsson, G. Gustaisson, Flexible light emitting diodes from soluble conducting polymers, vol. 357, Jun. 11, 1992, page 477–479. Here, polyaniline is used as the hole injecting electrode on a poly(ethyleneterephthalate) (PET) where poly(2-methoxy-5-(2'-ethyl-hexoxy)1,4 phenylenevinylene) (MEH-PPV) has been utilized as the emitter, and calcium has been utilized as the electron injecting layer. Besides polyaniline, it is possible to use poly(3,4 ethylenedioxythiophene) as the hole injecting electrode in this invention.

The light emitting layer or sub-layer can be constructed of just one polymer material. It is also possible to make this emitting layer or the sub-layer of a polymer blend, copolymers or blockcopolymers or blends of such polymers. In such a blend, at least one polymer has to be luminescent.

When this separately built layer is fabricated, a known spin coating method is primarily used, of the kind mentioned below; But it is also possible to fabricate such a layer through casting from solution or by melting. Also dip-forming and smearing of the this thin layer is a possibility.

As mentioned earlier, one of the advantages with this invention is that the separately built layer can be exposed to a pre-treatment or a treatment as an intermediate step, before it is laminated to the rest of the substrate. Such a intermediate step could be stretching, in order to orient the polymer chains in the stretching direction. Another possible pre- or intermediate treatment is a chemical treatment of the polymer layer in order to modify its properties or chemical structure.

The most promising use of the electroluminescent devices, according to the invention, is as displays with large area. They can be used as they are, or in combination with other known devices, for example together with liquid crystals (LCD). The possibility to fabricate stretch-oriented, polarised light emitting layers and this also on non-stretched substrates makes it possible to combine known fabrication steps with solvent-based coating of the polymer film and the color tunability with a polarization filter. The device could then be used as a back light for conventional LCD screens.

As mentioned in the examples, the invention has been tested on three different materials, poly(3 (4 octylphenyl) 2,2'bithiophene) (PTOPT), poly(3-(4-octylthiophene)) (POPT) and poly(3-octylthiophene) (POT). The invention is aimed at transferring any kind of thin film polymer material from a carrier. In its broad aspects, the invention is useful for any of the materials that are above mentioned in the PCT-publications and other publications, which all are included in this description as references. Within the frame of the invention, there is a special use of substituted polythiophenes—and poly(p-phenylenevinylene)—based polymers, a poly(p-phenylene) or a substituted poly (thiophenylenevinylene) as emitters in the invention.

In the performed examples, polyethylene foil(GLAD, DowBrands Europe GmbH, Dusseldorf, Germany) was used as the carrier. Also other types of temporarily carriers can be used as long as the carrier material has properties, which allow the polymer film to leave the carrier after some treatment. The polymer film is then transferred to a permanent substrate.

In the following examples the electroluminescent intensity has been measured using a photo diode (Hamamatsu, 101-BR). The EL intensity is presented in $10^{-12}$A.

BRIEF DESCRIPTION OF THE DRAWINGS

Some non-limiting examples of the invention described below, with reference to the attached drawings, wherein.

DETAILED DESCRIPTION

Figure 1:
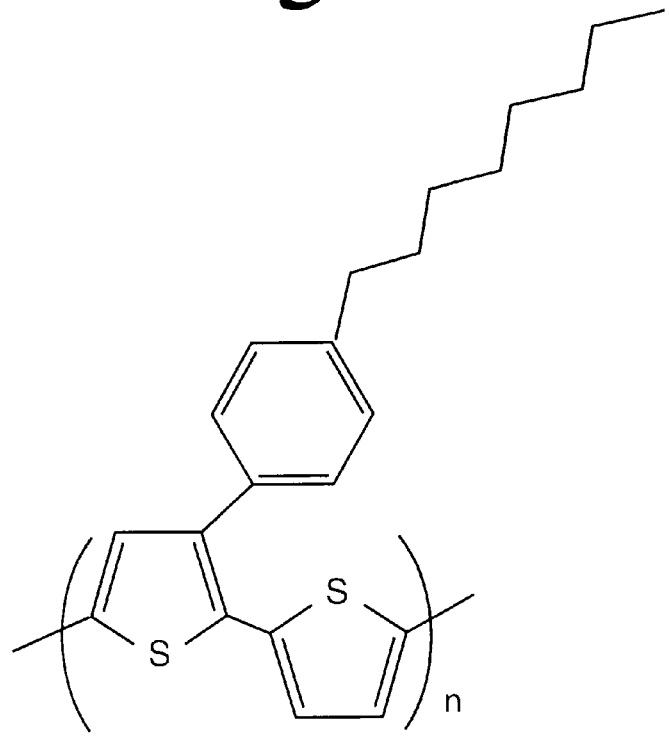
FIG. 1 shows the chemical structure of poly [3 (4 octylphenyl)-2,2'bithiophene].

In the performance examples, all the steps have been carried out at room temperature, and in ambient atmosphere, if nothing else is described. In the examples, the following abbreviations are used for the polymers:
POPT: poly(3 (4 octylthiophene))
PTOPT: poly(3-(4-octylphenyl)-2,2'bithiophene)
POT: poly(3-octylthiophene)
PCHMT: poly(3-cyclohexyl-4-methylthiophene)
PE: polyethylene The polymer film thickness, discussed in the performed examples, has been estimated by measuring the optical absorption of the films. The thickness has then been calculated using data where film thickness have been related to the thickness measured by a surface profilometer.

The examples show that it is possible to fabricate polarized light sources of a separately made, stretch oriented polymer layer, which is laminated onto the other parts of a diode. The examples show also that, by using the same method, it is possible to fabricate diodes without any mechanical treatment of the polymer layer. The fabricated device, with stretch oriented layers, where PTOPT is the emitting layer, showed a quantum efficiency of 0.1% and a turn on voltage of 2V. Similar results have been reached using other types of materials. Other materials with better orientation properties will increase the polarization degree in these devices. Comparing devices with and without a stretch-oriented layer did not show any decreased performance properties, when using the invention and stretching the polymer layer.

EXAMPLE 1

In this performed example, an electroluminescent device was fabricated, in which the light emitting layer was of one layer structure and was made as a separate layer, which, after fabrication, was laminated to the other part of the electroluminescent device's layer.

POPT was dissolved in chloroform(CHCl3 pro analysis) to the concentration 5 g POPT per liter $CHCl_3$. A PE-foil with a thickness of approximately 10 µm (trade mark GLAD®) was mounted on a circular plastic substrate (polystyrene petri dish), the purpose of which is to keep the PE-foil planar and make mounting in a photoresist spinner facility possible. The plastic substrate with the PE-foil was mounted in the photoresist spinner facility, with the PE-foil pointing upwards. Hexane (n-hexane, $C_6H_{14}$, purum) was applied on the PE-foil, and the plastic substrate with the PE-foil was rotated at 1000 rpm for 30 s. The PE-foil was dried on its plastic substrate in an oven at 40° C. for 10 min. The dried PE-foil on its plastic substrate was than again mounted in the photoresist spinner facility. The POPT solution was applied on the PE-foil, which the was rotated at 1000 rpm for 30 s. After this amount of time, the solvent was evaporated. The thickness of the POPT layer was determined to be 50 nm. The two-layer film of POPT and PE, prepared in this way, was stretched mechanically to a length, which was 1.5 times the initial length.

The substrate, which had a first electrode layer, for fabrication of the electroluminescent device, was purchased on the market from Balzers, Switzerland, under the trade mark BALTRACON. This substrate consisted of glass with a thickness 2 mm, and had on one of its sides a coating of indium tin oxide (ITO), with a thickness of 100 nm. This substrate was cut to become a square slab 15 mm long on each side. Photoresist was applied on the ITO-layer, so that the photoresist layer covered an area of 5×15 $mm^2$ at one edge of the glass slab. The photoresist was dried in an oven at 100° C. for 4 min. After the drying, the area of the ITO layer not covered by photoresist, was etched by an etch solution, which consisted of 50% $H_2O$, 50% HCl and a few drops of $HNO_3$. The etching was made during a time of 10 min. Then, the photoresist layer was removed, in a manner well known to the specialist, by rinsing in a cleaning solution, specially designed for this purpose, during 20 min. After that the substrate was rinsed in another cleaning solution, specially designed for this purpose, and then rinsed in acetone and finally rinsed in ethanol.

The etched and from photoresist freed substrate, with its remaining ITO-layer, was heated to 60° C. on a heating rod made of copper. Then the two-layer structure of POPT and PE was placed on the substrate, in a why such that the POPT layer was turned towards the ITOlayer of the substrate. The two-layer structure was then pressed onto the substrate using a rubber roll. Simultaneously, the temperature was raised to 80–90° C. At this temperature the PE-foil was detached from the POPT-layer, which remained on the substrate.

On top of the POPT-layer, a second electrode layer was vacuum evaporated in the following way. On the substrate with the POPT-layer, a shadow mask was mounted, which had holes corresponding to the desired electrode pattern. The substrate with the shadow mask was introduced into the evaporation chamber of an evaporation equipment. This chamber was evacuated to a pressure $p<10^{-6}$ torr. After that, first calcium, and then aluminum (purity 99.5%) was applied in the form of layers, onto the POPT layer. The obtained calcium layer thickness was 20 nm., and the obtained aluminum layer thickness was 100 nm.

Connections were then made in a usual way to both of the electrodes, and it was found that the electroluminescent device, fabricated in this way, during applicating of a voltage of 6 V emitted-red and near-infrared light, visible in daylight. The intensity ratio was 1.6 between the light emitted parallel to the stretching direction, and light emitted perpendicular to the stretching direction.

EXAMPLE 2

In this example, an electroluminescent device, consisting of two organic layers which emitted polarised light, was fabricated.

The substrate, which had a first electrode layer, and which was aimed to be used for the construction of the electroluminescent device in the first example was also used here.

The substrate was etched and the photoresist was removed. After this, the substrate was spin-coated with a layer of PTOPT. This was done by spinning a solution of PTOPT on top of the substrate. The solution consisted of PTOPT in chloroform (8 mg/ml). The spin rate was 1000 rpm.

A carrier, a PE foil with a thickness of 10 mm, was washed with n-hexane ($C_6H_{14}$) at 1000 rpm (spinning) for 30s. Then, the carrier was transferred to an oven and was dried at 40° C. for 10 min. The carrier was then mounted to a holder and these two were then placed on the spinner. The carrier was then covered with a first layer of PTOPT, utilizing the spin-coating technique. PTOPT was dissolved in chloroform(CHCl3) (8 mg/ml). The PTOPT solution was then applied onto the carrier and the carrier was rotated for 30s at 1000 rpm. After that the solvent ($CHCl_3$) had left the film, which now had a thickness of 50 nm. Then, the foil, together with the PTOPT film, was double its prior length.

The substrate, with the ITO electrode and the PTOPT layer, was heated to 60° C. Then the elongated foil, with the stretched-oriented PTOPT layer on top, was added to the substrate/ITO/PTOPT structure, stretch oriented PTOPT to PTOPT. The two-layer structure was pressed gently to the substrate structure using a rubber-roller. At the same time, the temperature was increased to 80° C.–90° C. After this, the PE foil was removed and the stretch-oriented film remained on the-substrate (substrate/ITO/PTOPT/stretched PTOPT).

On top of the PTOPT layers, a second electrode was deposited by vacuum evaporation in the same way as in Example 1. The calcium layer was 20 nm and the aluminum layer was 100 nm. Connections were made to the two electrodes.

Figure 2:
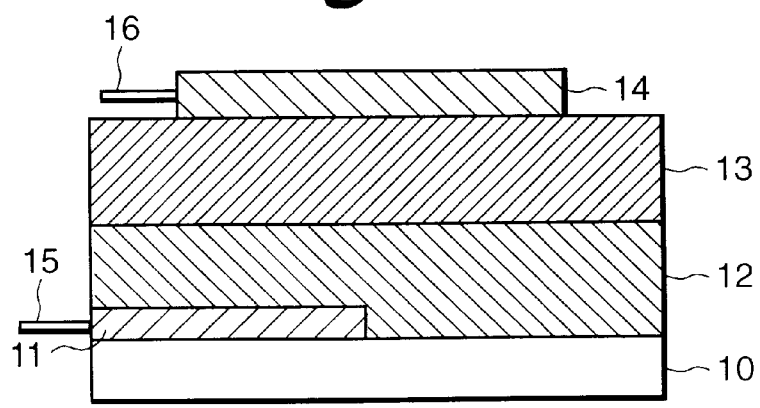
FIG. 2 shows a cross-section through an electroluminescent device according to the invention.

The device structure of this example is shown in FIG. 2 and consists of a substrate 10, an ITO electrode 11 at one edge of the substrate, a first (bottom) PTOPT layer 12 fabricated through spin coating, a second (separate) PTOPT layer 13 made through spin-coating in combination with stretch-orienting and transferring, and a metal electrode 14 consisting of calcium and with an aluminum protecting layer. There are also connections 15 and 16 attached to the two electrodes 11 and 14.

Measurements were carried out using the device, and the results are shown in FIG. 3–6 and in the Tables 1 and 2.

The behavior of the electroluminescent device was verified through measurements of the current versus voltage and the polarization behavior of the emitted light with respect of the spectral distribution and the electroluminescence intensity. A broad emission with peaks at 630 nm and at 680 nm was detected when the voltage was applied. The electroluminescence intensity was higher parallel to the stretch direction compared to the perpendicular direction. The polarization ratio was 2,4.

The color of the emitted light is best described as red-orange and the intensity was high enough for the emission to be clearly observable in indoor light. The normalized emission spectra shown in FIG. 5 differ very little, but a small shift towards lower energy occurs for the light emitted parallel to the stretch direction. This was also expected, since the effective conjugation length is increased when stretching the polymer material, which leads to a decrease of the band gap. The IV characteristics for this device are very similar to the same kind of polymer light emitting diode utilizing PTOPT as the emitter, but where the polymer layer is not oriented. This shows that it is possible to use this transferring procedure without losing the performance of the device, i.e. having a proper polymer film. The external quantum efficiency of this device varied from 0.01% at 3V to 0.1% at 9V.

The measurements of the polarization properties were carried out in the following way: A polarisation filter was placed between the polymer light emitting diode and a photo detector. The polarization filter was rotated while the intensity was measured for some angles. The result of this is given in FIG. 6. This polarization behavior corresponds to similar measurements of photoluminescence for oriented MEH-PPV, T W Hagler et al, Physical Review B 44, 8652 (1991). The achieved polarization ratio of 2.4 indicates that the emission mostly occur in the stretch oriented layer. On the basis of this the polarization ratio has to be over 10 in the oriented layer to achieve a polarization ratio of 2.4 if the emission was equally distributed over the entire polymer volume. All measurements were carried out at room temperature, in ambient atmosphere and on one and the same diode.

EXAMPLE 3

Example 2 was repeated, but POPT was now used as the emitting layer instead of PTOPT.

Connections were achieved in the same way for the electrodes, and POPT was used for the stretching instead of PTOPT. The PE/POPT structure was elongated 1.5 times the initial length. The thickness of the POPT layer was 100 nm before the stretching procedure.

Then the device was connected to wires and voltage applied. The device emitted polarized light with color of red-near infrared. The light was bright enough to be visible in indoor light at 6V. The intensity parallel to the stretching direction was 1.6 times higher than the intensity parallel to the stretching direction. The turn on voltage and the quantum yield were not estimated.

EXAMPLE 4

Example 2 was once again repeated, but here, POT was utilized as the emitting material. The elongation of the PE/POT structure was here 2.5 times. The thickness of the POT film was 100 nm before the stretching-procedure.

After that the device was connected to wires and then the voltage was applied, whereupon the device emitted polarized light with color of red-orange. The light was bright enough to be visible in indoor light at 6V. The electroluminescent intensity parallel to the orientation direction was 3.1 times higher than the intensity perpendicular to the orientation direction. The turn-on voltage and the quantum efficiency were not estimated.

EXAMPLE 5

In this performed example, an electroluminescent device was fabricated, where a charge transport layer of PCHMT was inserted between the emitting layer and one electrode.

PTOPT was dissolved in chloroform (5 mg/ml). A PE foil with a thickness of 10 mm (GLAD) was mounted on a circular plastic holder(polystyrene), with the purpose to fix the PE foil in a planar geometry during processing. The holder, with the PE foil, was mounted to the spinner. The PE surface was cleaned with hexane(n-hexane), and the PE foil was rotated by the spinner at 1000 rpm for 30s. The foil was then dried in an oven at 40 C for 10 min. The holder with the PE foil was then again mounted on the spinner. The PTOPT solution was then spin coated at 1000 rpm for 30s on the PE foil. After this time, the polymer was completely dry, with no solvent left. The thickness of the PTOPT film was 500 nm.

This same substrate, which had a first electrode layer, that was used in Example 1 for the construction of the electroluminescence device in Example 1 was also utilized here.

The substrate was mounted with the ITO surface up. A PCHMT solution (10 mg/ml in chloroform ($CHCl_3$)) was applied to the substrate. The spinner was started and the substrate was rotated at 1000 rpm for 30s. After this time, the solvent had evaporated. This resulted in a film thickness of 100 nm.

After this the two-layer substrate was mounted to a holder and the PE/PTOPT was added to the PCHMT surface, PTOPT against PCHMT. The PE/PTOPT film was then pressed to the substrate with a rubber roller at the same time as the temperature was increased to 80° C.–90° C. At this temperature, the PE foil was removed and the PTOPT film remained on the PTOPT film.

On top of the PTOPT layer, a second electrode was then vacuum-evaporated in the following way. The substrate was mounted to a shadow mask. The substrate, with the shadow mask, was then transferred to the vacuum chamber. The chamber reached a pressure of p $<10^{-6}$ Torr. Then, a coating of calcium was applied by vacuum evaporation to a thickness of 20 nm. Then a coating of 100 nm of aluminum was applied in the same way.

Connections for the electrodes were made in the same way as before. The electroluminescent device emitted light with a red-orange colour. It was possible to observe the light in ordinary indoor light at an applied voltage of 30V. The turn on voltage was 20V. The quantum efficiency were not estimated.

TABLE 1

Figure 3:
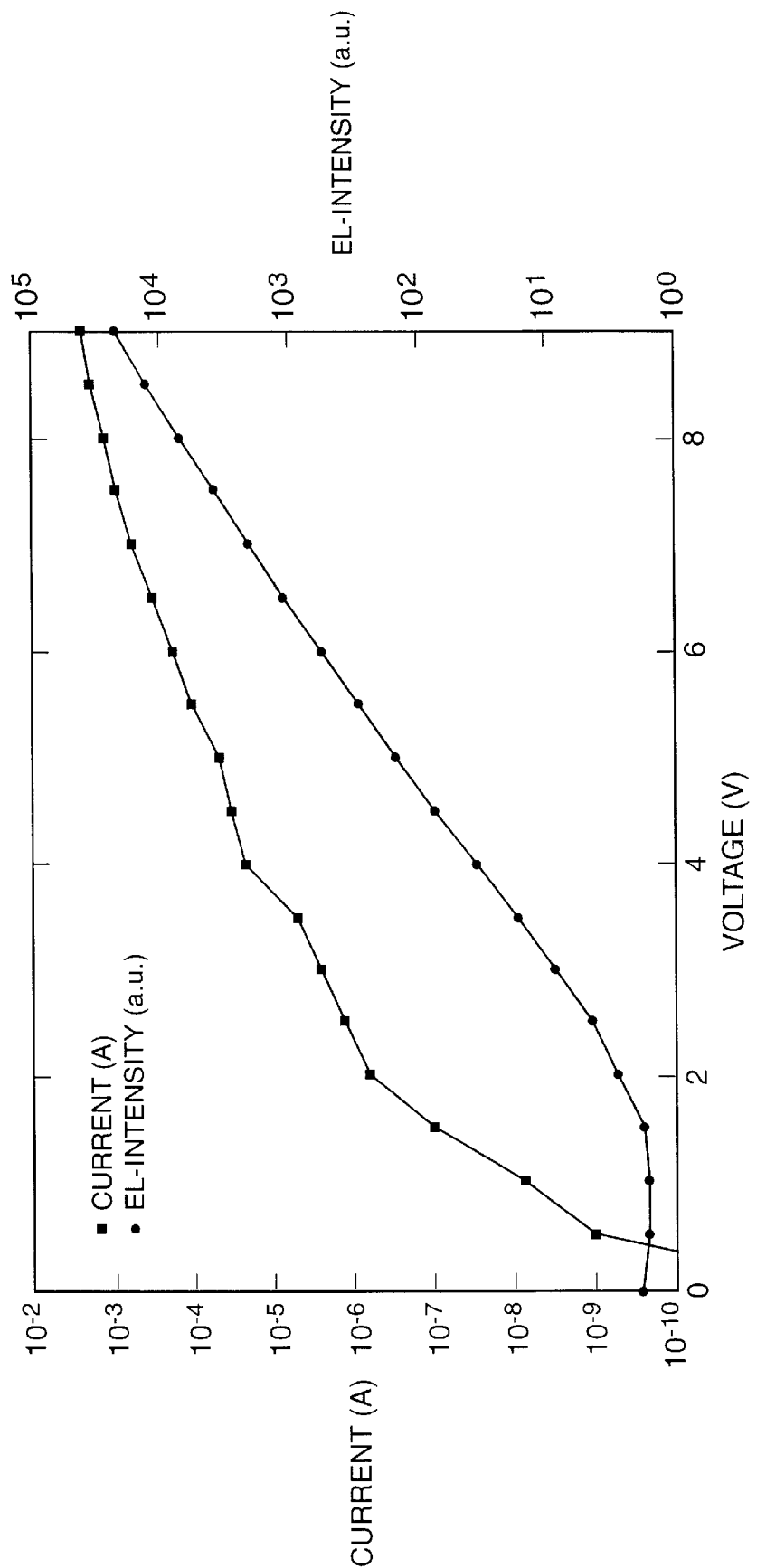
FIG. 3 shows a diagram wherein the current (A) as a function of voltage (V) and the electroluminescence intensity as a function of voltage (V). The current is depicted with filled squares and values along the left vertical axis and the electroluminescence intensity is depicted with filled circles and-values along the right vertical axis. The voltage values are given along the horizontal axis.
Figure 4:
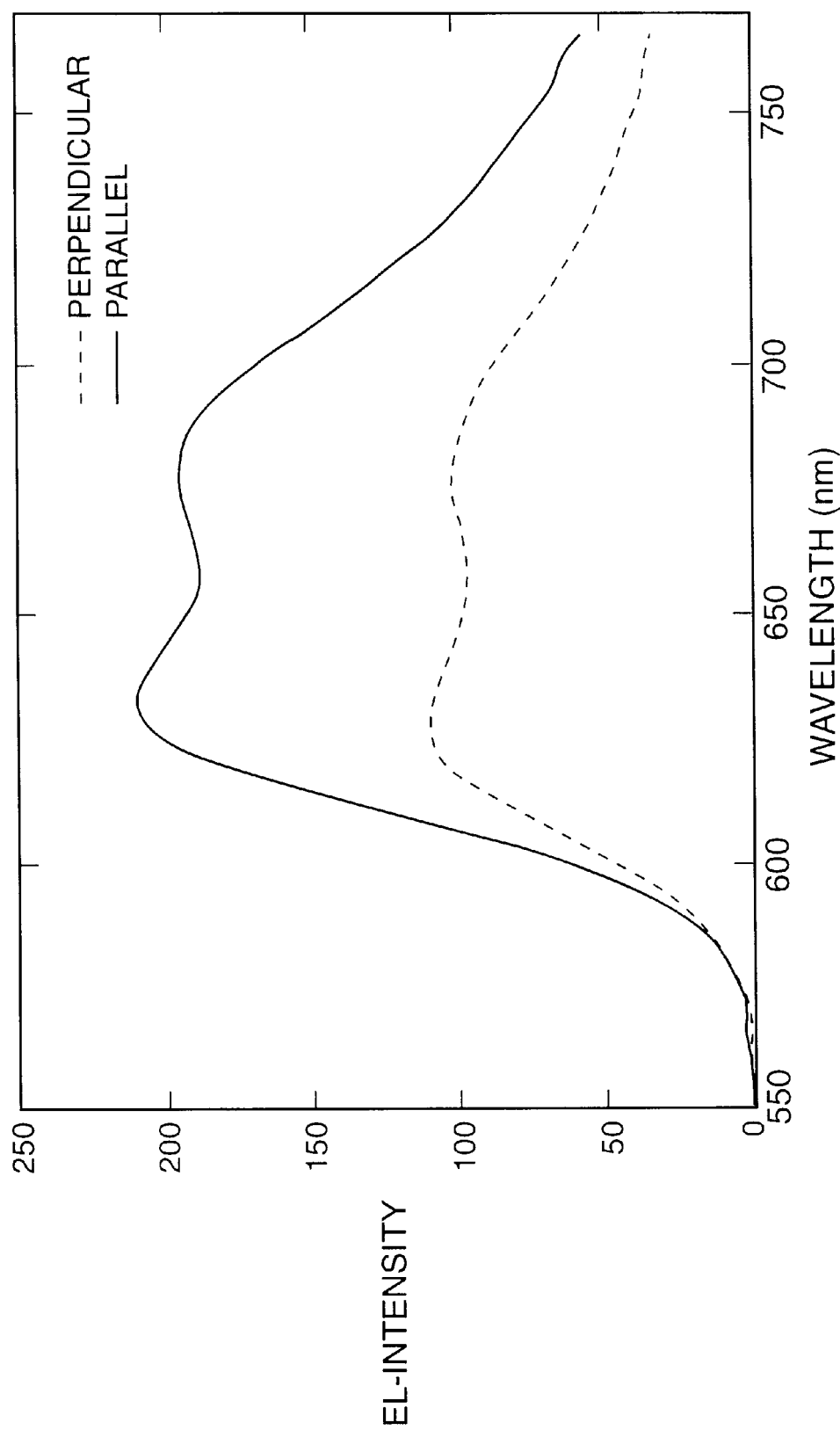
FIG. 4 shows a diagram wherein the intensity of the electroluminescence is depicted as a function of the wave length (nm). A solid line shows the intensity in the parallel direction and a dashed line the intensity in the perpendicular direction.
Figure 5:
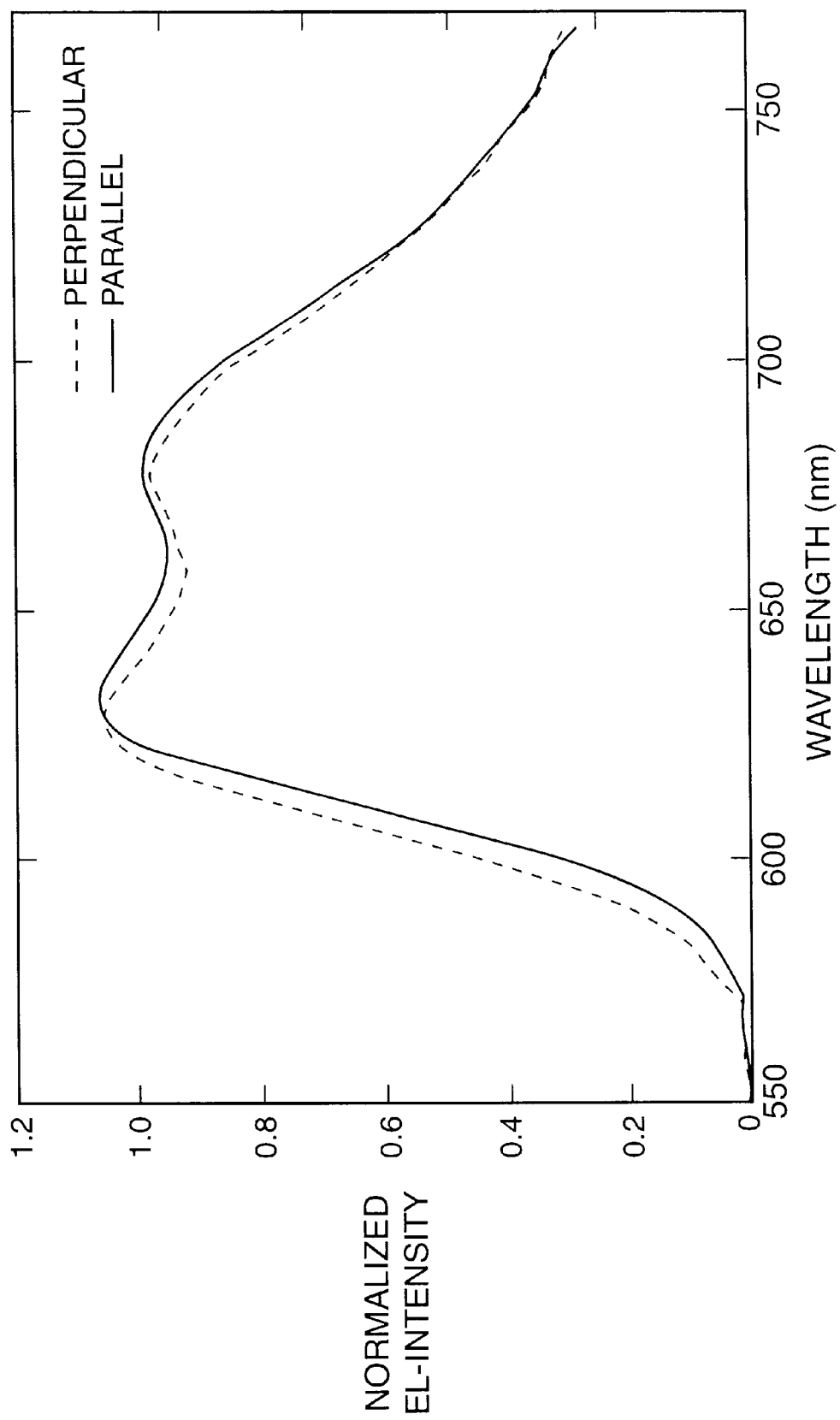
FIG. 5 shows a diagram wherein the normalized electroluminescence intensity is shown as a function of the wave length where the solid line corresponds to the parallel direction and the dashed line to a perpendicular direction.

Datapoints for diagrams in Figure 3.

| Datapoint | Voltage (V) | Current (A) | EL-intensity ($10^{-12}$ A) |
|---|---|---|---|
| 0 | 0.0 | −1.8638 $10^{-11}$ | 1.9 |
| 1 | 0.5 | 1.0731 $10^{-09}$ | 1.7 |
| 2 | 1.0 | 7.7792 $10^{-09}$ | 1.7 |
| 3 | 1.5 | 1.0548 $10^{-07}$ | 1.8 |
| 4 | 2.0 | 6.5557 $10^{-07}$ | 2.9 |
| 5 | 2.5 | 1.3736 $10^{-06}$ | 4.5 |
| 6 | 3.0 | 2.6278 $10^{-06}$ | 8.6 |
| 7 | 3.5 | 5.1868 $10^{-06}$ | 17.3 |
| 8 | 4.0 | 2.2593 $10^{-05}$ | 35.1 |
| 9 | 4.5 | 3.3157 $10^{-05}$ | 73 |
| 10 | 5.0 | 4.6391 $10^{-05}$ | 148.7 |
| 11 | 5.5 | 0.00010032 | 294.2 |
| 12 | 6.0 | 0.00017163 | 569.8 |

TABLE 1-continued

Datapoints for diagrams in Figure 3.

| Datapoint | Voltage (V) | Current (A) | EL-intensity ($10^{-12}$ A) |
|---|---|---|---|
| 13 | 6.5 | 0.00032005 | 1088.9 |
| 14 | 7.0 | 0.00058631 | 2057 |
| 15 | 7.5 | 0.00092694 | 3776 |
| 16 | 8.0 | 0.0013126 | 6772 |
| 17 | 8.5 | 0.0018476 | 12538 |
| 18 | 9.0 | 0.0023666 | 21670 |

TABLE 2

Figure 6:
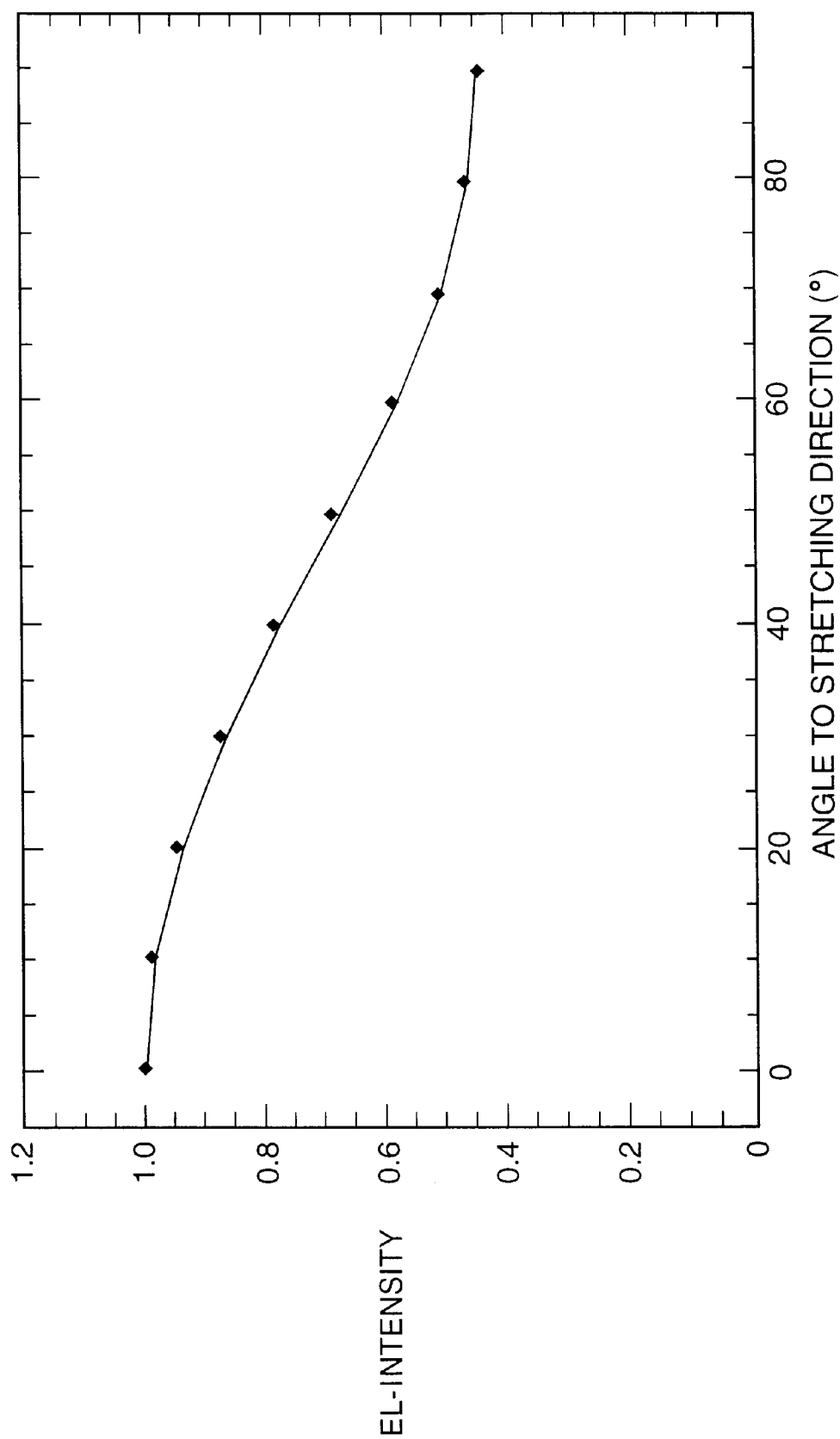
FIG. 6 shows a diagram the electroluminescent intensity is depicted as a function of the angle to the direction of stretching.

Datapoint for diagrams in Figure 6.

| Datapoint | Angle to stretch direction (°) | Relative EL-intensity |
|---|---|---|
| 0 | 0.0000 | 1.0000 |
| 1 | 10.000 | 0.99038 |
| 2 | 20.000 | 0.94519 |
| 3 | 30.000 | 0.87212 |
| 4 | 40.000 | 0.78173 |
| 5 | 50.000 | 0.68654 |
| 6 | 60.000 | 0.58942 |
| 7 | 70.000 | 0.50673 |
| 8 | 80.000 | 0.46346 |
| 9 | 90.000 | 0.43942 |

We claim:

1. An electroluminescent device, comprising:

a supporting substrate;

a first electrode layer applied on said substrate;

at least one light-emitting layer applied on said first electrode layer and on said substrate, said at least one light-emitting layer comprising a conjugated polymer having a light-emitting capability;

a second electrode layer applied on said at least one light-emitting layer;

respective connections provided to each of said electrode layers, for operatively connecting said device to other structure;

said at least one light-emitting layer having at least a part which is laminated to said substrate and at least another part of which is laminated to said first electrode layer.

2. The electroluminescent device of claim 1, wherein:

said substrate is made of a transparent or translucent material.

3. The electroluminescent device of claim 1, wherein:

said first light-emitting layer comprises a polymeric material having polymer chains oriented substantially in one direction by being stretch-oriented.

4. The electroluminescent device according to claim 3, wherein:

said at least one light-emitting layer further includes a second light-emitting layer situated further from said substrate than is said first light-emitting layer;

said first light-emitting layer comprising a conjugated polymer or polymeric mixture, and said second light-emitting layer comprising a conjugated polymer or polymeric mixture;

said second light-emitting layer being laminated to said first light-emitting layer.

5. The electroluminescent device according to claim 1, wherein:

said first electrode layer is formed on said first light-emitting layer; and said second light-emitting layer is formed as a separate layer laminated after being formed, to said first light-emitting layer.

6. The electroluminescent device of claim 1, wherein:

said polymer of said at least one light-emitting layer is made of a conjugated polymer or mixture of polymers, having oriented polymer chains.

7. The electroluminescent device of claim 6, wherein:

said conjugated polymer or mixture of polymers comprises at least one member selected from the group consisting of a substituted poly(thiophene), poly(p-phenylenevinylene), a substituted poly(p-phenylenevinylene), a substituted poly(p-phenylene), poly(thiophenvinylene), and a substituted poly (thiophenevinylene).

8. The electroluminescent device of claim 1, wherein:

said at least one light-emitting layer comprises at least one polymer selected from the group consisting of poly[3 (4 octylphenyl) thiophene], poly [3-4(4-octylphenyl)-2,2'-bithiophene], poly(3-alkylthiophene), poly(3-cyclohexyl-4-methylthiophene) and poly(3-cyclohexylthiophene).

9. The electroluminescent device of claim 1, wherein:

said at least one light-emitting layer comprises two light-emitting layers, including one made of a poly(p-phenylvinylene) and another made of poly (cyanoterephthalyidene).

10. The electroluminescent device of claim 1, wherein:

one of said first and second electrode layers comprises an electron-injecting layer made of a material selected from the group consisting of a metal, a metal alloy, a doped semiconductor, and a doped polymer having a low work function.

11. The electroluminescent device of claim 1, wherein:

one of said first and second electrode layers comprises a hole-injecting layer made of a material selected from the group consisting of a metal, a metal alloy, a metal oxide, a doped semiconductor, and a doped polymer having a high work function.

12. The electroluminescent device of claim 10, wherein:

the other of said first and second electrode layers comprises a hole-injecting layer made of a material selected from the group consisting of a metal, a metal alloy, a metal oxide, a doped semiconductor, and a doped polymer having a high work function.

13. The electroluminescent device of claim 1, wherein:

said first electrode layer comprises a thin film of a material selected from polyaniline, poly(3,4-ethylenedioxythiophene) and indium tin oxide, and is arranged to function in said device as a hole-providing contact; and said second electrode layer comprises a thin layer of at least one material selected from calcium, aluminum, magnesium, indium, sodium, lithium, scandium and silver, and is arranged to function in said device as an electron- providing metal contact.

14. The electroluminescent device of claim 1, wherein:

said substrate comprises a material selected from glass, polyethyleneterephthalate and polyethylene.

15. A method for fabricating an electroluminescent device, comprising the steps of:

providing a substrate;

applying on said substrate a first electrode layer;

applying partly on said substrate and partly on said first electrode layer a first light-emitting layer;

forming a second light-emitting layer on a support;

applying said second light-emitting layer, on said support, to said first light-emitting layer, then removing said support form said second light-emitting layer;

applying a second electrode layer on said second light-emitting layer; and providing connections to said first and second electrodes, for electrically connecting said device to other structures;

said first and second light emitting layers each comprising a respective conjugated polymer or polymer mixture.

16. The method of claim 15, wherein:

said step of providing includes providing said substrate of a transparent or translucent material.

17. The method of claim 15, wherein:

said support comprises a foil having a surface presented towards said second light-emitting layer for said forming step, a material having a releasing property in relation to said second light-emitting layer, for thereby facilitating practice of said removing step.

18. The method of claim 17, wherein:

said surface of said foil comprises a material selected from the group consisting of polyethyleneterephthalate and polyethylene.

19. The method of claim 15, wherein:

said step of providing includes providing said substrate of a material selected from the group consisting of glass, polyethyleneterephthalate and polyethylene.

20. The method of claim 15, wherein:

said step of forming said second light-emitting layer on said support comprises using a technique selected from casting, smearing, dip-coating and spin-coating of a layer-forming polymeric material on said substrate.

21. The method of claim 15, further comprising:

subsequent to practicing said forming step, stretching said second light-emitting layer and said support and thereby directionally orienting polymeric chains of said conjugated polymer or polymer mixture of said second light-emitting layer prior to applying said second light-emitting layer on said first light-emitting layer.

22. The method of claim 15, wherein:

said conjugated polymer or mixture of polymers comprises at least one member selected from the group consisting of a substituted poly(thiophene), poly(p-phenylenevinylene), a substituted poly(p-phenylenevinylene), a substituted poly(p-phenylene), poly(thiophenvinylene), and a substituted poly (thiophenevinylene).

23. The method of claim 15, wherein:

said at least one light-emitting layer comprises at least one polymer selected from the group consisting of poly[3 (4 octylphenyl) thiophene], poly [34(4-octylphenyl)-2,2'-bithiophene], poly(3-alkylthiophene), poly(3-cyclohexyl-4-methylthiophene) and poly(3-cyclohexylthiophene).

24. The method of claim 15, wherein:

said at least one light-emitting layer comprises by two light-emitting layers, including one made of a poly(p-phenylvinylene) and another made of poly (cyanoterephthalylidene).

25. The method of claim 15, wherein:

one of said first and second electrode layers comprises an electron-injecting layer made of a material selected from the group consisting of a metal, a metal alloy, a doped semiconductor, and a doped polymer having a low work function.

26. The method of claim 15, wherein:

one of said first and second electrode layers comprises a hole-injecting layer made of a material selected from the group consisting of a metal, a metal alloy, a metal oxide, a doped semiconductor, and a doped polymer having a high work function.

27. The method of claim 25, wherein:

the other of said first and second electrode layers comprises a hole-injecting layer made of a material selected from the group consisting of a metal, a metal alloy, a metal oxide, a doped semiconductor, and a doped polymer having a high work function.

28. The method of claim 15, wherein:

said first electrode layer comprises a thin film of a material selected from polyaniline, poly(3,4-ethylenedioxythiophene) and indium tin oxide, and is arranged to function in said device as a hole-providing contact; and said second electrode layer comprises a thin layer of at least one material selected from calcium, aluminum, magnesium, indium, sodium, lithium, scandium and silver, and is arranged to function in said device as an electron- providing metal contact.

* * * * *